(12) United States Patent
Tanaka

(10) Patent No.: US 9,190,240 B2
(45) Date of Patent: Nov. 17, 2015

(54) CHARGED PARTICLE MICROSCOPE APPARATUS AND IMAGE ACQUISITION METHOD OF CHARGED PARTICLE MICROSCOPE APPARATUS UTILIZING IMAGE CORRECTION BASED ON ESTIMATED DIFFUSION OF CHARGED PARTICLES

(71) Applicant: Hitachi High-Technologies Corporation, Minato-ku, Tokyo (JP)

(72) Inventor: Maki Tanaka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/252,839

(22) Filed: Apr. 15, 2014

(65) Prior Publication Data
US 2014/0319341 A1 Oct. 30, 2014

(30) Foreign Application Priority Data
Apr. 26, 2013 (JP) ................. 2013-093209

(51) Int. Cl.
G21K 7/00 (2006.01)
H01J 37/22 (2006.01)
H01J 37/26 (2006.01)
H01J 37/28 (2006.01)

(52) U.S. Cl.
CPC .............. *H01J 37/222* (2013.01); *H01J 37/263* (2013.01); *H01J 37/28* (2013.01); *H01J 2237/2817* (2013.01)

(58) Field of Classification Search
CPC ......... H01J 37/44; H01J 37/244; H01J 37/22; H01J 37/266; H01J 37/285; H01J 37/28; H01J 37/268; H01J 37/292; H01J 37/2955; H01J 43/00; H01J 43/007; H01J 43/008; G01Q 30/02

USPC .............................. 250/6, 307, 311
See application file for complete search history.

(56) References Cited

U.S. PATENT DOCUMENTS

| 4,556,797 | A | * | 12/1985 | Kuni et al. ............... 250/492.2 |
| 5,095,207 | A | * | 3/1992 | Tong ........................ 850/63 |
| 8,461,527 | B2 | | 6/2013 | Nakahira et al. |

FOREIGN PATENT DOCUMENTS

JP 2008-177064 A 7/2008

OTHER PUBLICATIONS

Bishop, M., et al., "Feasibility Study for High Energy SEM-Based Reference Measurement System for Litho Metrology", Characterization and Metrology for ULSI Technology 2005, pp. 407-410.

*Primary Examiner* — Nicole Ippolito
*Assistant Examiner* — Jason McCormack
(74) *Attorney, Agent, or Firm* — Miles & Stockbridge PC

(57) ABSTRACT

A charged particle microscope apparatus includes a radiation optical system that radiates a focused charged particle beam to an upper side of a sample provided with a pattern and scans the sample; a detection optical system that detects charged particles generated from the sample to which the charged particle beam has been radiated by the radiation optical system; and a processing unit that processes the charged particles detected by the detection optical system to obtain a charged particle image of the sample, estimates diffusion of the charged particles at any depth of the pattern of the sample, on the basis of information on a depth or a material of the pattern of the sample or radiation energy of the charged particle beam in the radiation optical system; corrects the obtained charged particle image using the estimated diffusion of the charged particles; and processes the corrected charged particle image.

10 Claims, 10 Drawing Sheets

CHARGED PARTICLE MICROSCOPE APPARATUS AND IMAGE ACQUISITION METHOD OF CHARGED PARTICLE MICROSCOPE APPARATUS UTILIZING IMAGE CORRECTION BASED ON ESTIMATED DIFFUSION OF CHARGED PARTICLES

CROSS-REFERENCE TO RELATED APPLICATIONS

This application claims the priority of Japanese Patent Application No. 2013-093209, filed on Apr. 26, 2013, which is incorporated herein by reference in its entirety.

BACKGROUND OF THE INVENTION

1. Field of the Invention

The present invention relates to a charged particle microscope apparatus and an image acquisition method of a charged particle microscope apparatus.

2. Description of the Related Art

In a manufacturing process of a semiconductor wafer, miniaturization of patters multilayered on the wafer has progressed rapidly, and importance of a process monitor to monitor whether the patterns are formed on the wafer as designed has increased more and more. Recently, there are growing needs for confirmation of states of patterns buried under a surface through a process as well as patterns viewed on the surface or confirmation/measurement of a positional relation of such lower layer patterns and upper layer patterns exposed to the surface, due to complication of a minute pattern formation process by a limitation of exposure technology or changes in device structures.

As a tool for inspecting semiconductor pattern shapes, an optical inspection device based on bright field or dark field optical microscope technology or an inspection device of an electron beam type based on electron microscope technology has been widely used for managing a semiconductor wafer manufacturing line. Likewise, an optical type or an SEM type review device has been used when a detected defect is observed, and a scatterometry system or a scanning electron microscope for line width measurement using light has been used in a device for measuring pattern dimensions.

A dimension of a leading-edge semiconductor pattern has decreased to several-ten nanometer order and an inspection/measurement device developed from an electron microscope, particularly, a scanning electron microscope (critical dimension scanning electron microscope (SEM)) has been widely used to accurately recognize a state of the pattern or the defect.

However, in a general SEM that is used for semiconductor inspection/measurement in an in-line manner, only a pattern of an outermost surface of a sample can be observed. For this reason, the general SEM cannot be used to inspect or observe the buried layer.

In order to resolve the above problem, there have been some cases in which a lower layer pattern is inspected or measured by using an SEM having relatively high radiation energy. In "Feasibility Study for High Energy SEM-Based Reference Measurement System for Litho Metrology" by M. Bishop and D. Joy, Characterization and Metrology for ULSI Technology 2005, pp. 407-410 (2005), an example of the case in which a lower layer pattern is observed by increasing radiation energy an electron beam of an SEM, which is normally between several hundred eV to several keV and several ten keV is described.

SUMMARY OF THE INVENTION

Information on a pattern not exposed to a surface can be obtained by radiating the electron beam having the relatively-high energy. However, diffusion is generated in an inner portion of a surface layer until the electron beam arrives at the pattern to be inspected and measured. As a result, space resolution of the electron beam radiated to the pattern to be observed may be degraded. For this reason, a shape of the pattern cannot be accurately observed and, accordingly, dimension measurement precision may be degraded in measurement using an image thereof. In "Feasibility Study for high Energy SEM-Based Reference Measurement System for Litho Metrology" by M. Bishop and D. Joy, Characterization and Metrology for ULSI Technology 2005, pp. 407-410 (2005), a change in the resolution is discussed. However, necessity for optimization of imaging conditions only suggested and a resolving means thereof is not discussed. An example of a response to the resolution degradation due to the diffusion of the electrons on the surface of the pattern is described in JP-2008-177064-A. However, an application to observation of an internal pattern of a laminate is not discussed.

A charged particle microscope apparatus including: a radiation optical system that radiates a focused charged particle beam to an upper side of a sample provided with a pattern and scans the sample with the charged particle beam; a detection optical system that detects charged particles generated from the sample to which the charged particle beam has been radiated by the radiation optical system; and a processing unit that processes the charged particles detected by the detection optical system to obtain a charged particle image of the sample, estimates diffusion of the charged particles at any depth of the pattern of the sample on the basis of information on a depth or a material of the pattern of the sample or information on radiation energy of the charged particle beam in the radiation optical system, corrects the obtained charged particle image using the estimated diffusion of the charged particles, and processes the corrected charged particle image.

According to the present invention, a charged particle microscope apparatus capable of inspecting, observing, and measuring a lower layer pattern with a higher image quality and an image acquisition method of the charged particle microscope apparatus can be provided.

DESCRIPTION OF THE PREFERRED EMBODIMENTS

Hereinafter, a method of executing a process having considered an influence of diffusion of electrons in a solid, thereby improving an image quality of a buried pattern not exposed to an outermost surface in an SEM image, will be described.

In a first embodiment, a method of calculating diffusion of electrons in a solid from SEM imaging conditions (e.g. a structure/material of a target pattern, a focusing pattern depth, and radiation energy of electrons), compensating for resolution of a lower layer pattern image using an estimated degradation function, and providing an image having a high quality is disclosed.

In a second embodiment, a method of applying the first embodiment to patterns of a plurality of layers observed at the same time is disclosed.

In a third embodiment, a method of previously estimating a dimension measurement error of a buried layer pattern using a restored image obtained by the first or second embodiment, correcting the measurement error, and realizing measurement with high precision is disclosed.

In a fourth embodiment, a condition setting method to image an optimal image to carry out the first to third methods is described.

In a fifth embodiment, a method of applying the first to fourth methods to an opening pattern is described.

The methods described above can be applied to various charged particle beam apparatuses (an SEM, an ion microscope, and the like). However, in the following embodiments, a representative example of the case of using the SEM will be described.

First Embodiment

Basic Flow of Lower Layer Observation

Figure 1:
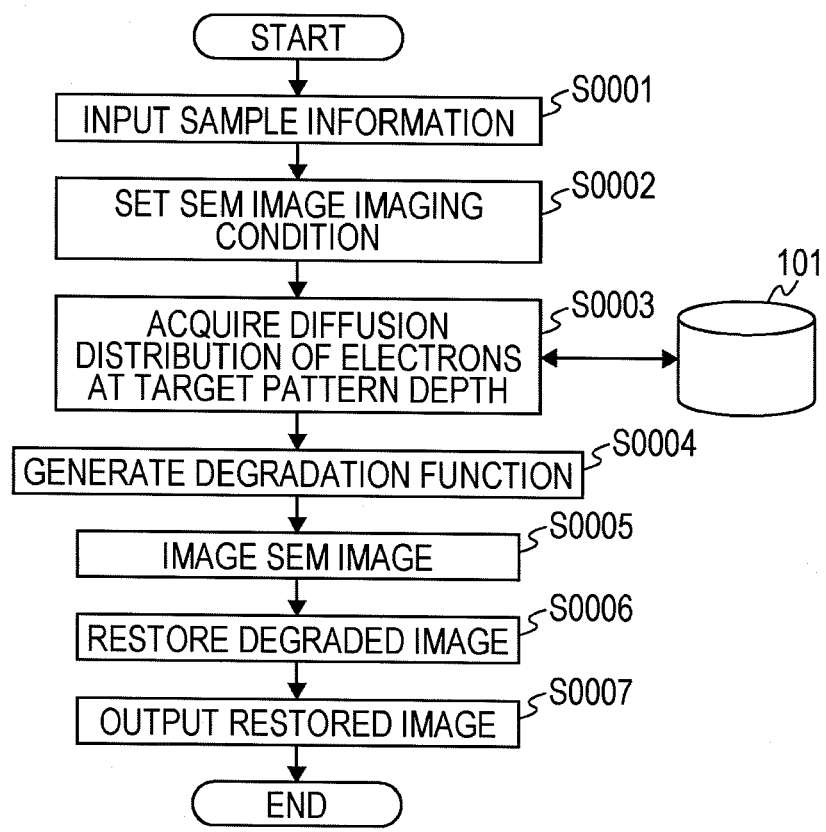
FIG. 1 is a flowchart illustrating an image quality improvement process for a lower layer pattern.

FIG. 1 illustrates a schematic flow of an image restoration process for a buried pattern according to the present invention.

First, information on a sample pattern to be an observation target is input (S0001). As the pattern information, an entire laminate structure including a focusing layer (buried layer) and a material and a thickness of each layer are input and, if necessary, a schematic pattern dimension or pitch is input. Structure data may be individually input. However, the focusing layer may be designated by a GUI after design data is read using TCAD.

Next, conditions to image an SEM image are set (S0002). The imaging conditions include radiation energy, a focal point, an amount of radiation current, an imaging magnification, and a pixel size of a primary beam. The details of radiation energy and focus setting methods will be described below.

Next, diffusion distribution information on incident electrons at a depth of the focusing layer is acquired from a storage unit 101, on the basis of the information set in S0001 and S0002 described above (S0003).

Next, a resolution degradation function of a pattern portion of the focusing layer depth of the image is generated using the acquired diffusion distribution information on the electrons (S0004). Through the previous steps, information necessary for restoration becomes ready.

Next, imaging is performed under the conditions set in S0002 (S0005).

An image restoration process (S0006) using the degradation function generated in S0004 is executed on the imaged SEM image, an image obtained by compensating for the resolution degradation is generated, and an image obtained as a result is output (S0007). When a different part of the same structure pattern is observed, steps of S0005 to S0007 may be repeated under the same conditions as the previous imaging and image processing, after an image acquisition area is changed by a movement of a stage or a shift of an electron beam radiation position.

Next, a pattern structure to be inspected, observed, or measured of the present invention and an effect of the present invention will be described using FIGS. 2A to 2E.

Figure 2A:
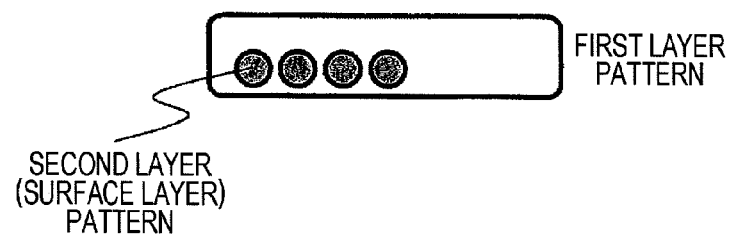
FIGS. 2A to 2E are diagrams illustrating an example of an observation target pattern, a problem, and an effect of the present invention.
Figure 2B:
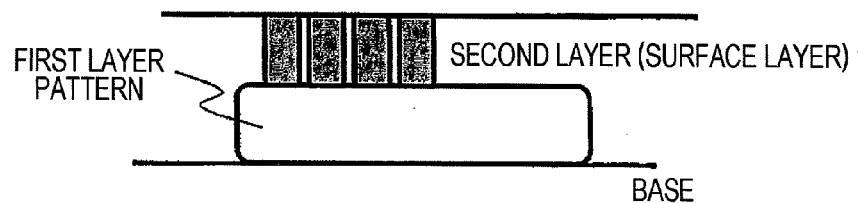

FIGS. 2A to 2E illustrate an example of a pattern structure according to the present invention. FIG. 2A illustrates a top view and FIG. 2B illustrates a cross-sectional view. FIGS. 2A to 2E illustrate an example of a pattern in which a square pattern of a first layer formed of a conductive material is provided on a base, an insulating film such as an oxide film is formed as a second layer on the first layer pattern, hole patterns (in FIGS. 2A to 2E, four holes) are formed in the second layer, and a conductive material for electrical connection is buried in the holes of the second layer. In this case, a confirmation on whether the first layer pattern is damaged and deformed in the course of forming the second layer or a positional relation of the first layer pattern and the second layer pattern is a desired positional relation has become more important as a result of recent minuteness and complication of a semiconductor pattern.

Figure 2C:
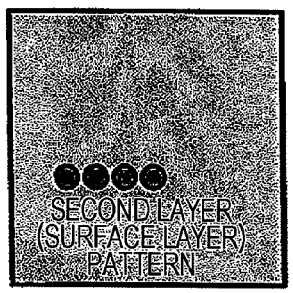
Figure 2D:
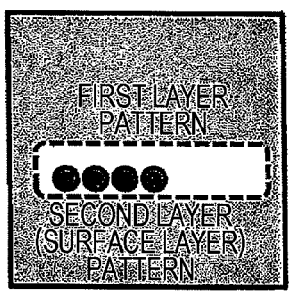
Figure 2E:
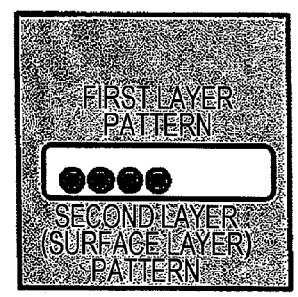

However, as illustrated in FIG. 2C, in a beam having relatively low radiation energy from several hundred eV to several keV in the related art, only a pattern of a surface can be observed, and it is difficult to obtain information on a lower layer (in this case, the first layer). Meanwhile, an electron beam having relatively high radiation energy is radiated under appropriate conditions according to a pattern, so that the information on the lower layer can be obtained, as illustrated in FIG. 2D. However, when the lower layer pattern is observed, because electrons infiltrating into a solid may diffuse, an effective beam diameter at a target pattern depth may increase and resolution of an image is degraded. In the example of FIGS. 2A to 2E, an edge of the first layer pattern becomes unclear. Meanwhile, the present invention provides an electron microscope apparatus that estimates a diffusion degree of the beam in the solid, on the basis of information on a pattern depth, a material, and electron beam radiation energy obtained in advance, restores degradation of resolution by image processing, and that can clearly observe the edge of the buried lower layer pattern as illustrated in FIG. 2E.

Figure 3:
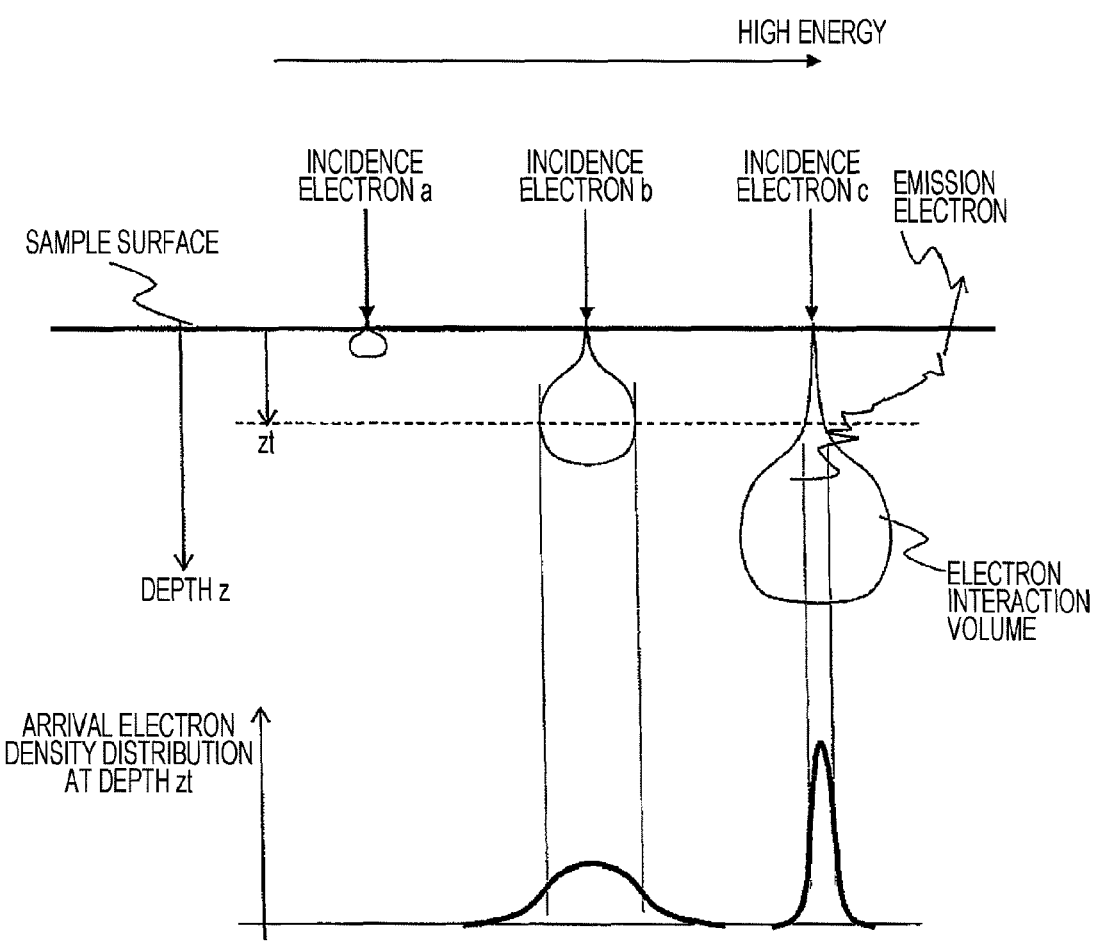
FIG. 3 is a diagram illustrating a mechanism of resolution degradation due to diffusion of electrons in a solid.

Next, enlargement of the effective beam diameter by scattering of electrons in the solid will be described using FIG. 3. FIG. 3 is a schematic view of a change of diffusion of electrons in the solid, depending on the radiation energy.

When the radiation energy is high, the electrons infiltrate more deeply into the solid and diffuse in a wide range. However, focusing on a certain depth zt and looking at a diffusion range of the electrons at the certain depth, the figure shows that a diffusion degree of radiated electrons is not necessarily larger merely because the radiation energy is higher. The diffusion range of radiated electrons at any depth is herein called an "effective beam diameter" for convenience.

At a lower side of FIG. 3, a frequency distribution of electrons arriving at the depth zt is illustrated. Among incident electrons a having low energy, there is no electron arriving at the depth zt, and it is difficult to obtain information on a pattern at the depth zt. Incident electrons b having high energy can arrive at the depth zt. However, because an effective beam diameter increases, resolution is degraded. Incident electrons c having higher energy move straight forward more deeply and, therefore, an effective beam diameter is maintained relatively small, providing superior resolution. However, the electrons having the high energy pass through the focusing pattern and filtrate more deeply. For this reason, the electrons including the information on the pattern are not necessarily detected, and attention is required. In addition, different from normal electron beams that move forward in a vacuum, because energy of radiated electrons are lost due to diffusion of the electrons in the solid, the energy of the electrons radiated to the focusing pattern becomes irregular. For this reason, it should be noted that the same information as the pattern exposed to the surface is not necessarily obtained merely because the electrons arrive at the certain depth. A method of setting appropriate conditions in that case will be described in a fourth embodiment.

As such, the information on the focusing pattern is not necessarily obtained sufficiently merely because the electrons arrive at the depth of the focusing pattern to be the observation target. According to a pattern and an object (e.g. inspection, observation, or measurement), appropriate imaging conditions need to be set. In addition, an enlargement of the effective beam diameter may not be avoided even under conditions where a large amount of information can be obtained, like the incident electrons b of FIG. 3. The setting of the appropriate imaging conditions will be described in detail in the fourth embodiment. In the first embodiment, a method of compensating for the degradation of the resolution of the image due to the enlargement of the effective beam diameter will be described.

Figure 4:
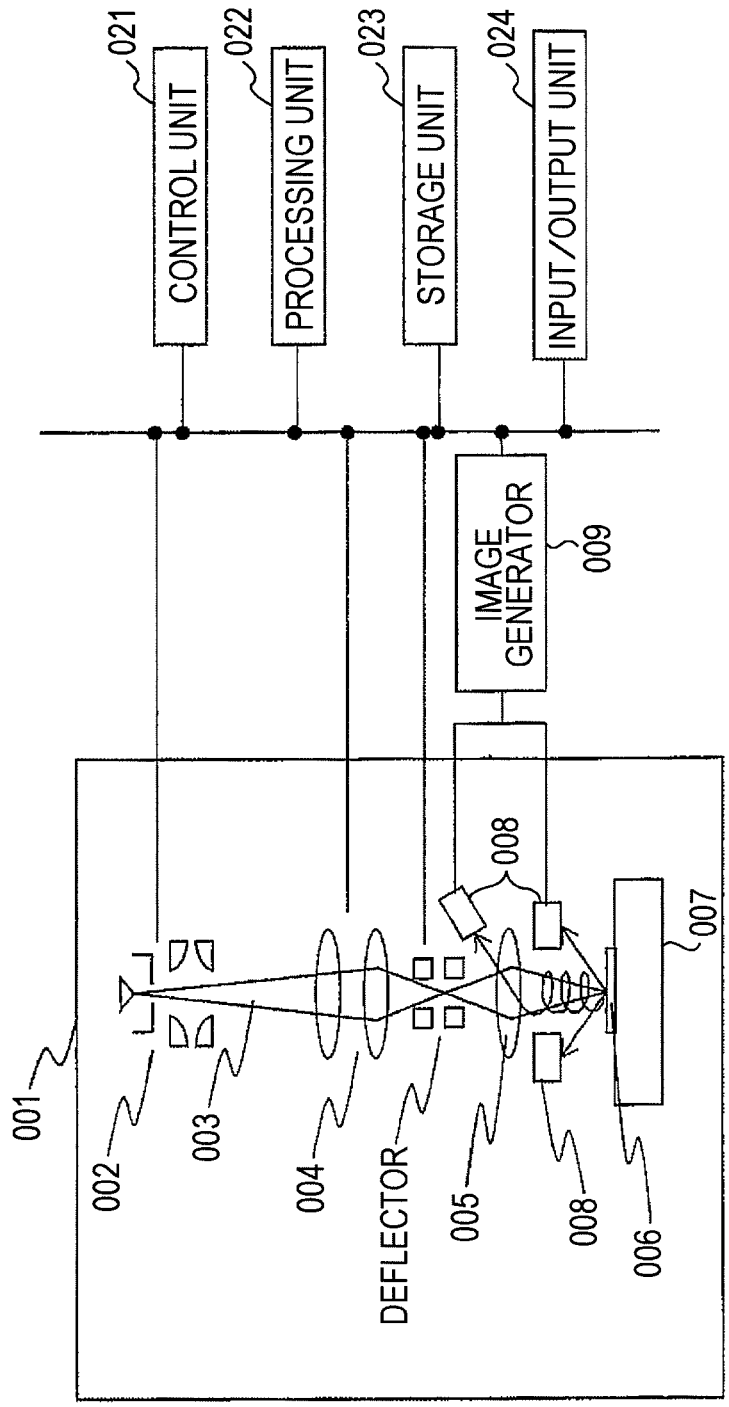
FIG. 4 is a diagram illustrating a configuration of an SEM according to the present invention.

FIG. 4 illustrates a basic configuration of the SEM serving as an embodiment of the present invention.

For example, the SEM includes an imaging device 001, a control unit 021, a processing unit 022, a storage unit 023, and an input/output unit 024. In acquisition of an imaging image, a primary electron beam 003 is generated from an electron gun 002, is focused by a condenser lens 004, passes through an objective lens 005, and is focused on a surface of a sample 006. Next, electrons, such as secondary electrons or reflected electrons, generated from the sample 006 are detected by a detector 008, a digital image is generated from a detection signal by an image generator 009, and thereby an imaging image is acquired. The imaging image is stored in the storage unit 023. By moving a stage 007, an image can be imaged at any position of the sample. As the detector 008, a plurality of detectors such as a secondary electron detector configured to detect a large amount of secondary electrons and a reflected electron detector configured to detect a large amount of reflected electrons may be used. In addition, a height measurement sensor (not illustrated in the drawings) to measure a height of the sample may be used.

The control unit 021 controls a voltage applied to a peripheral portion of the electron gun 002, adjustment of focal points of the condenser lens 004 and the objective lens 005, a movement of the stage 007, and operation timing of the image generator 009. The acquisition of information on the diffusion of the electrons at the target depth in S0003, the generation of the degradation function in S0004, and the restoration of the degraded image in S0006 are executed by the processing unit 022. In the storage unit 223, the imaging image, the restored image, the imaging conditions, and the sample information are stored. An input of the sample information, an input of the imaging conditions, and an output of the imaging image or the restored image are executed by the input/output unit 224.

Next, a method of estimating a degradation function of resolution in an SEM image of a buried pattern will be described. In S0003 of FIG. 1, a diffusion distribution of electrons at a target pattern depth is read from data stored in the storage unit 101 in advance. The diffusion distribution can be acquired using a Monte Carlo simulation of electron scattering. As illustrated in FIG. 3, when electrons are implanted into a predetermined material, a diffusion aspect of the electrons in the solid and a position, energy, and a direction of the electrons at each depth can be acquired. Therefore, information on the electron diffusion may be calculated in advance for combinations of energy of incident electrons and a target material. The calculated information may be stored in the storage unit 101.

In the example of FIG. 3, the diffusion aspect of the electrons in the solid of uniform material is illustrated. However, when the pattern exists on the upper layer, the phenomenon becomes complex. In this case, it is only necessary to complicate a model in line with an actual pattern structure, according to acquired image restoration precision. If high precision is not required, calculation may be executed based on major materials. If overlapping portions of the patterns are large in the upper layer and the lower layer, a plurality of data may be generated for each material of the upper layer and data may be changed over for each of different material regions of the upper layer pattern (in the example of FIGS. 2A to 2E, the two regions of the insulating film portion of the second layer and the buried material of the inner portion of the hole being the second layer pattern) when the image restoration process is executed. Because the pattern of the surface layer can be clearly observed, region division can be performed readily using a brightness difference of the regions or edge information on a boundary portion by the image processing.

Diffusion data of the electrons illustrated in FIG. 3 can be acquired through the above sequence. However, the phenomenon in an actual SEM is further complex. As illustrated in FIG. 4, because the electron beam is focused and radiated in the SEM, the electrons are not always incident vertically in actuality.

Figure 5A:
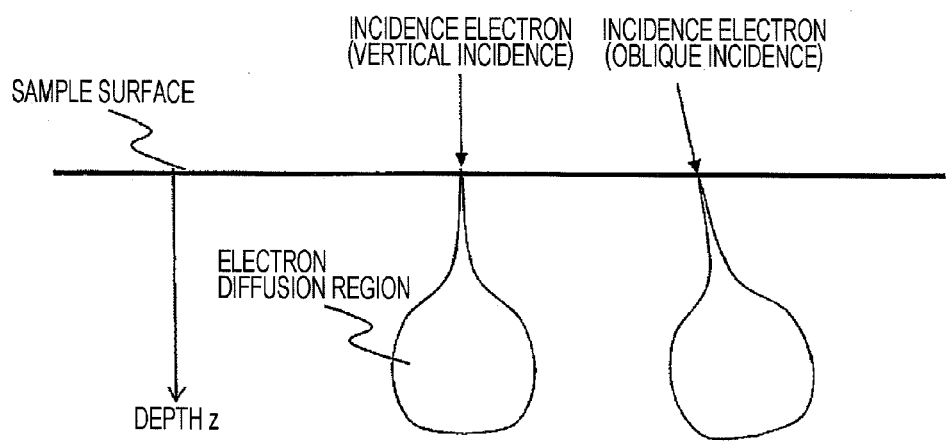
FIGS. 5A and 5B are diagrams illustrating an influence of a radiation direction of electrons and a focal point.

As illustrated in FIG. 5A, when the electrons are incident obliquely, an arrival position of the electrons in the solid is changed depending on an incidence direction. Therefore, when an opening angle of the electron beam of the SEM is large, it is necessary to calculate an effective beam diameter by considering an angle distribution of the electrons in the electronic beam. In addition, an effective beam diameter at a focusing depth zt also depends on a focal point of the electronic beam.

Figure 5B:
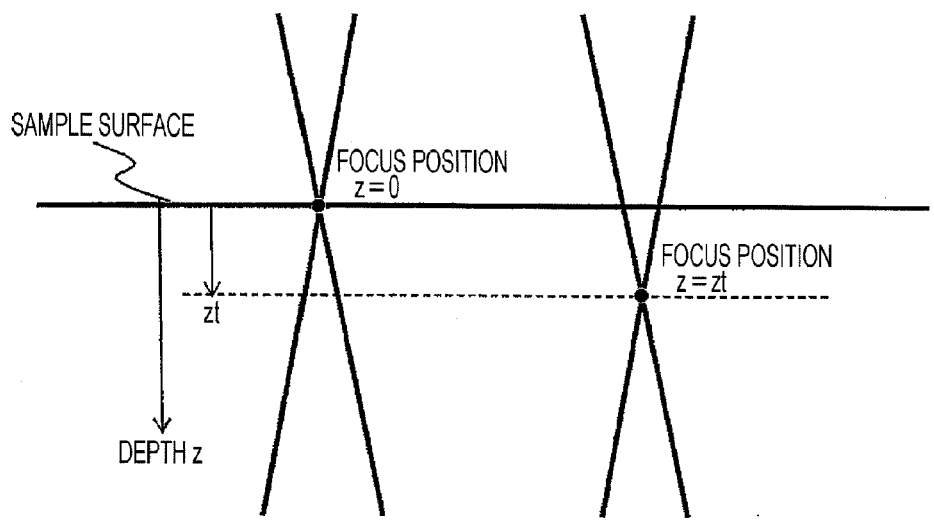

As illustrated in FIG. 5B, if the focal points are different from each other, a density distribution of electrons at each height changes (FIG. 5B is a schematic diagram when there is no diffusion in the solid, in which the electrons are distributed between two straight lines passing the focal points). For this reason, if the distribution of the electrons at the focusing height zt is calculated by considering an influence of a radiation direction in FIG. 5A and a distribution and a direction of electrons on a sample surface in FIG. 5B, a degradation function of image resolution degradation of a pattern at the focusing height can be estimated. Setting of the focal point of the beam will be described in detail in the fourth embodiment.

If the degradation function can be estimated by the above configuration, an image restoration process may be executed using the degradation function. A processing method for the image restoration process is disclosed in JP-2008-177064-A. It is possible to acquire, by the above process, a relatively clear image in which the resolution degraded by the diffusion of the electrons has been compensated.

As such, the imaging conditions of the pattern depth, the material, and the electron beam image are input and the image correction process is executed using the input information, so that the pattern shape of the buried layer can be observed more clearly or the position or the shape thereof can be measured more accurately. The image obtained in the above-described way is used, so that a workmanship inspection or an observation of defects of the pattern of the buried layer can be executed with higher precision.

Second Embodiment

Multilayer Processing Method

Next, a method of the case in which the process according to the first embodiment is applied to a multilayer pattern will be described as a second embodiment.

Figure 6A:
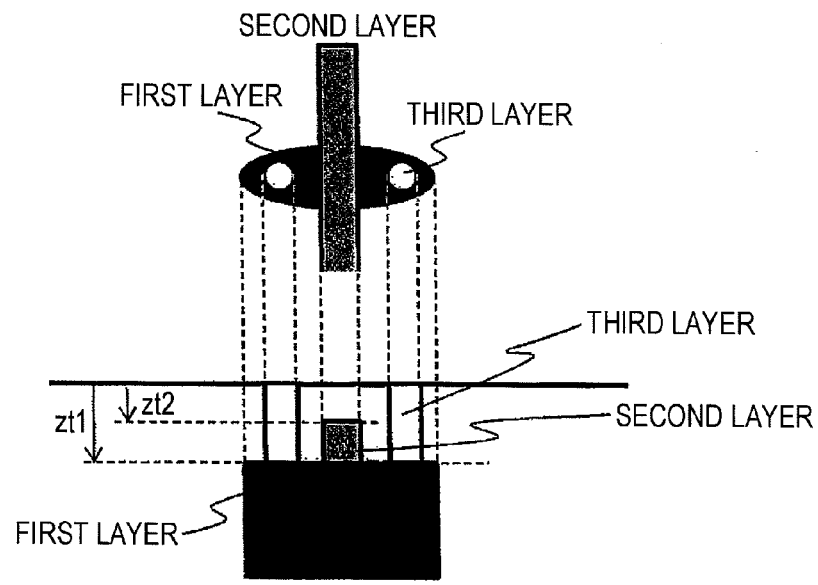
FIGS. 6A and 6B are diagrams illustrating a multilayer pattern structure and a restoration process.

As illustrated in FIG. 6A, in the case in which the depths of patterns are set in three steps (two layers are in buried patterns), it is likely that a sufficient effect may not be obtained when a process is executed at only one focusing height. Therefore, an image restoration process is executed for both focusing heights z1 and z2 and results thereof are integrated, so that an image having a higher image quality can be obtained.

Figure 6B:
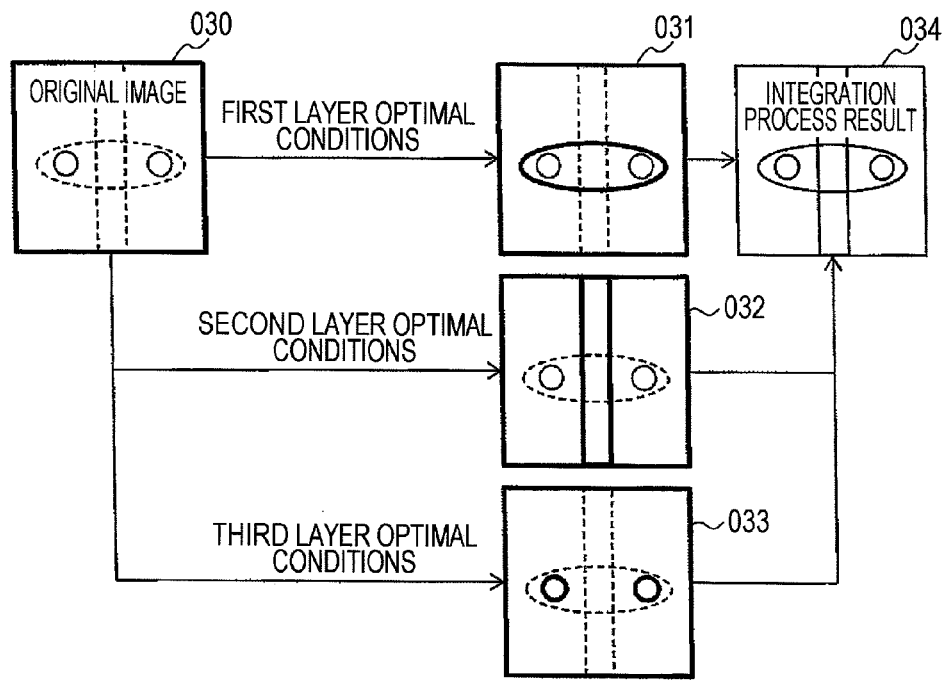

FIG. 6B illustrates an example of the process. For example, for an original image 030 imaged by focusing on an outermost surface (third layer) of a pattern, a degradation function at pattern heights zt1 and zt2 and in the outermost surface (that is, a beam shape of a state not affected by the diffusion in the solid) is estimated by the method disclosed in the first embodiment, and an image is generated by executing a process under each condition (031, 032, and 033). Next, region division is performed for each processing image or the original image 030 and a pattern of each layer is recognized. In this step, layout information such as design data may be used and the pattern may be recognized by designation by a user through a GUI, for a region division result. An integration process is executed using images restored under conditions optimized for a pattern observation for each of regions divided, on the basis of a pattern recognition result. Thereby, a high quality image can be obtained for a laminated structure of the patterns having the different depths. In the observation of the pattern, because an outer circumferential edge of each region has most important information, the obtained regions may be preferably slightly expanded and integrated, such that an edge portion is included in the divided region when the regions are integrated.

Alternatively, for the processing image of each layer, the large weight may be applied to the edge portion of each corresponding layer and a weighted average process may be executed.

In addition, observation of only a specific layer may be desired depending on a use object of an image. For example, for viewing a relation of the first layer and the third layer in FIGS. 6A and 6B, information on the second layer may be an obstacle. In this case, if the weighted average process in which the weight of the pattern portion of the second layer has been decreased is executed, unnecessary information can be decreased. Consequently, an image that can be easily viewed can be provided.

As such, for each of the patterns including the plurality of layers, the imaging conditions of the pattern depth, the material, and the electron beam image are input and the image correction process is executed using the input information, so that the pattern shape of the buried layer can be observed more clearly or the position or the shape thereof can be measured more accurately. Because the patterns of the plurality of different layers can be clearly observed and measured, measurement of misalignment between the layers can also be performed with high precision.

Third Embodiment

Dimension Correction Method

As a third embodiment, a method of decreasing an influence of resolution degradation of a lower layer pattern in dimension measurement using an SEM image will be described.

A degradation model of an image and a dimension measurement error will be described using FIG. 7.

Figure 7:
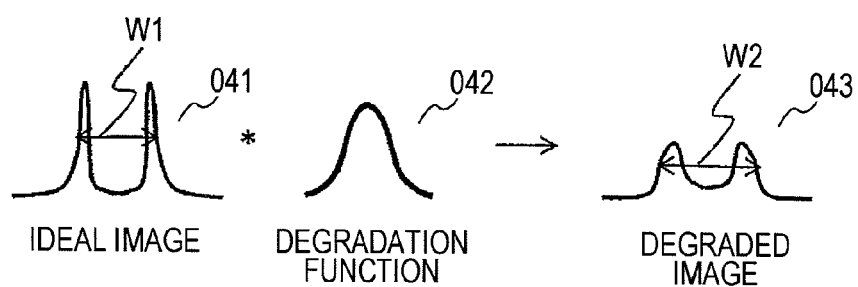
FIG. 7 is a diagram illustrating a resolution degradation model and a dimension measurement error.

As illustrated in FIG. 7, a degraded image 043 is represented by convolution of an ideal image 041 and a degradation function 042. Here, only the influence of the resolution is described and an influence of noises is omitted.

For an image of a lower layer buried pattern according to this embodiment, original pattern dimensions are considered to become more accurate dimensions when the pattern dimensions are calculated using an edge position in the ideal image. When dimensions are measured using, for example, a point where a height of a signal waveform used frequently in a current CD-SEM is a certain ratio (for example, 50%) as the edge position, a width W1 is a measurement result in the case of the ideal image 041. However, a width W2 obtained by the actually observed degraded image 043 may become larger than the width W1. Therefore, in the third embodiment, a method of correcting measurement error by calculating a value of the measurement error W2-W1 using the restored image obtained in the first embodiment, instead of the ideal image 041, is disclosed.

A flow will be described using FIGS. 8A and 8B.

When the pattern is measured, first, an image acquisition and measurement recipe (file in which an automatic image acquisition and measurement sequence is recorded as a task list of the device) is generated using a test pattern.

Figure 8A:
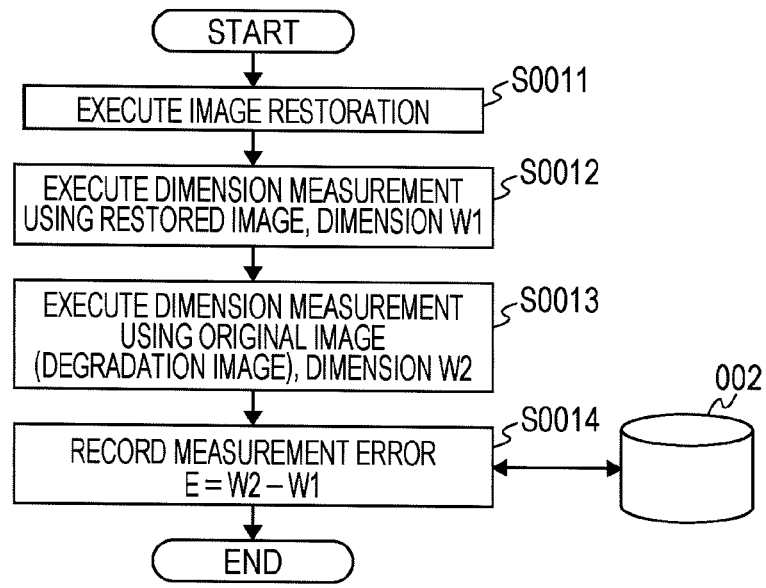
FIGS. 8A and 8B are flowcharts illustrating a dimension correction method process.
Figure 8B:
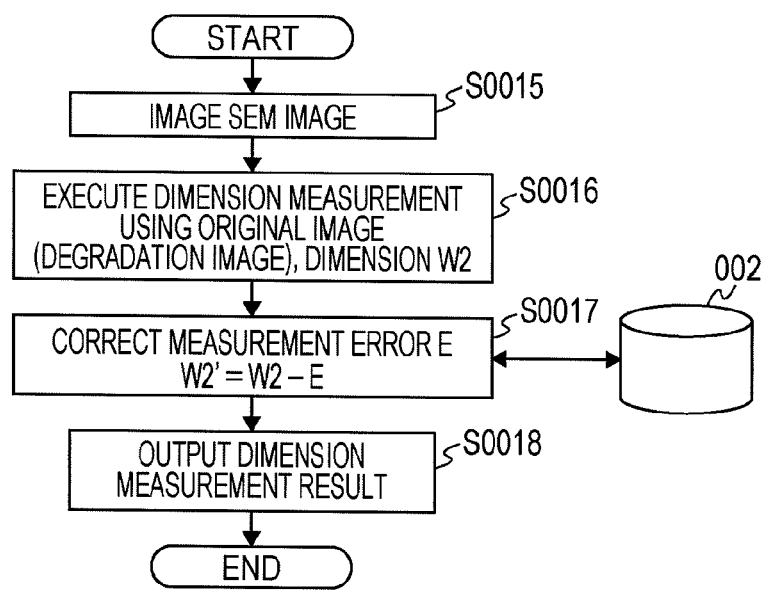

FIG. 8A illustrates a sequence at the time of generating the recipe. First, similar to the first embodiment, the image restoration process is executed using the test pattern (S0011).

Next, the pattern dimension W1 is measured using an image after the restoration (S0012). An error of a measurement result is not completely removed. However, the error decreases as compared with the original image in which the resolution has been degraded due to the diffusion of the electrons.

Next, a dimension W2 is calculated by a measurement process of the same conditions of the same pattern as the one in S0012, using the original image having the degraded resolution (S0013).

A difference of these measurement results is recorded in the recipe as an error caused by the resolution degradation due to the diffusion of the electrons in the solid, together with the imaging and measurement conditions (S0014). A measurement sequence using the recipe generated in the above-described way is illustrated in FIG. 8B.

When the measurement is performed, an SEM image is imaged under the conditions recorded in the recipe, similar to the normal SEM measurement (S0015).

Next, the measurement is performed using the degraded image as it is (S0016), the measurement error recorded in S0014 of FIG. 8A is subtracted from the measurement result (S0017), and an obtained result is output as a dimension measurement result (S0018). In this step, similar to the second embodiment, if the image restoration is performed in each layer and a measurement error is previously calculated for each layer, for the patterns of the plurality of layers, the same dimension correction can be performed. In the examples of FIGS. 7 to 8B, the dimension measurement error is corrected. However, the edge position may be corrected. If the edge position for each layer can be correctly calculated by combining the above methods, a pattern deviation amount (a misalignment amount and overlay) between the different layers can be calculated with high precision.

According to this embodiment, if the image restoration process is first executed using the test pattern, high-precision measurement of the other patterns is enabled by the same process as the measurement by the normal CD-SEM.

Fourth Embodiment

Imaging Condition Setting Method

Figure 9:
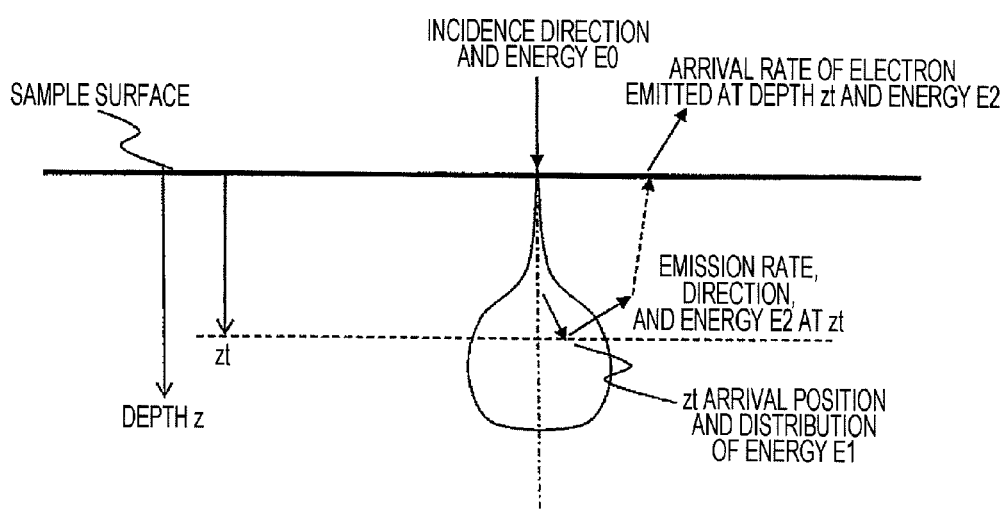
FIG. 9 is a diagram illustrating an optimal condition determination method of imaging of a pattern in a solid.

Next, a method of setting imaging conditions suitable for lower layer pattern imaging will be described using FIG. 9.

As described in FIGS. 3, 5A, and 5B, scattering of the electrons in the solid is changed by the material and the radiation energy and the radiation direction of the electrons. Unless optimal imaging conditions are set to an observation pattern, necessary information may not be obtained. Therefore, in a fourth embodiment, an imaging condition setting method made in view of the above circumstances is disclosed. Information on a lower layer pattern obtained by the SEM can be acquired by the course illustrated in FIG. 9.

First, electrons of energy $E_0$ radiated in a certain direction lose the energy thereof before the electrons arrive at the focusing depth $z_t$, and positions and directions thereof also change. Not all of the electrons that have arrived at the focusing depth $z_t$ contribute to image information. The probability of the electrons having passed through the focusing depth $z_t$ being reflected or exciting secondary electrons or angles and energy of the generated reflected electrons or secondary electrons are not constant, either. By these angles or energy, only a part of the electrons generated at the focusing depth $z_t$ arrives at an outermost surface and makes a contribution as an image. Therefore, conditions where information amount at the focusing depth $z_t$ is maximized are selected, so that an image of a buried layer having a higher image quality can be obtained. A depth z direction is divided into regions of appropriate sizes according to a pattern structure. As described above, in each region, (1) distributions of the energy, the positions, and the directions of the electrons arriving at the focusing depth $z_t$, (2) the generation probability, the direction, and the energy of the reflected or secondary electrons generated from the electrons passing through the focusing depth $z_t$ (for each condition of the energy and the direction of (1)), (3) the probability of the electrons (for each of the direction and the energy of (2)) generated at the focusing depth $z_t$ being emitted to a sample surface and energy and a direction thereof, and (4) detection characteristics (a direction and energy of electrons that can be detected) of an SEM of a current state are individually simulated on the basis of a physical model and a product thereof is calculated. Thereby, it becomes possible to calculate how much information on each depth can be obtained. If imaging conditions where the product is maximized at the focusing depth $z_t$ are selected, an image having a larger information amount can be obtained.

In the above example, the conditions where the information amount is maximized have been selected. However, a method of selecting conditions where pattern contrast at the focusing depth $z_t$ is maximized may alternatively be used. If patterns at the focusing depth $z_t$ include two kinds of materials A and B, an image having highest contrast can be acquired by executing the same calculation as the above case for each material and selecting conditions where a ratio of information amounts of the materials A and B is maximized.

Alternatively, when patterns formed in the buried layer (for example, a plurality of holes or wiring lines) are adjacent to each other and the patterns need to be clearly separated and observed, conditions where an effective beam diameter in a focusing layer decreases are selected for a distance between the patterns, so that the patterns can be clearly separated and observed or measured without an interference of information between the patterns.

In addition, when a plurality of layers are focused on, like the patterns illustrated in FIGS. 6A and 6B, conditions where an average of information amounts from the depths thereof is maximized may be selected.

Alternatively, a plurality of images are acquired under imaging conditions suitable for each layer and the plurality of acquired images are integrated by the integration process, similar to the second embodiment, so that an image having a higher image quality can be obtained. Next, setting of a focal point will be described. As illustrated in FIGS. 5A and 5B, the effective beam diameter at the focusing depth $z_t$ is determined by the diffusion of the electrons in the solid and the focal point of the electron beam. In order to minimize a beam diameter at the focusing depth $z_t$, although an influence of the diffusion of the electrons in the solid is inevitable, it is preferable to narrow the beam such that the focal point becomes $z=z_t$. However, when there is a pattern on a surface layer, an image quality of the surface layer pattern may be greatly degraded. The image of the buried layer is degraded by the diffusion of the electrons no matter how much the beam is narrowed. Therefore, when the surface layer and the buried layer are imaged at the same time, it may be preferable to focus on the surface layer to obtain an image having superior visibility as an entire image. For this reason, it is only necessary to determine the focal point of the beam according to a use object of an SEM image. As described above, because the image of the buried layer is degraded regardless of the focal point, it is difficult to use the image for focusing. For this reason, it is only necessary to adjust the focus using the pattern on the outermost surface and to add the offset of the depth from the outermost surface to obtain a desired depth.

According to the embodiment, the optimal imaging conditions can be determined to obtain information on the pattern of the desired buried layer. In addition, the imaging condition optimization and the first to third embodiments are combined, so that higher quality observation and inspection as well as the measurement of the dimensions or the misalignment amount with high precision can be realized. The image obtained in the above-described way is used, so that a workmanship inspection or an observation of defects of the pattern of the buried layer can be executed with higher precision.

Fifth Embodiment

Observation of Opening Pattern

Figure 10A:
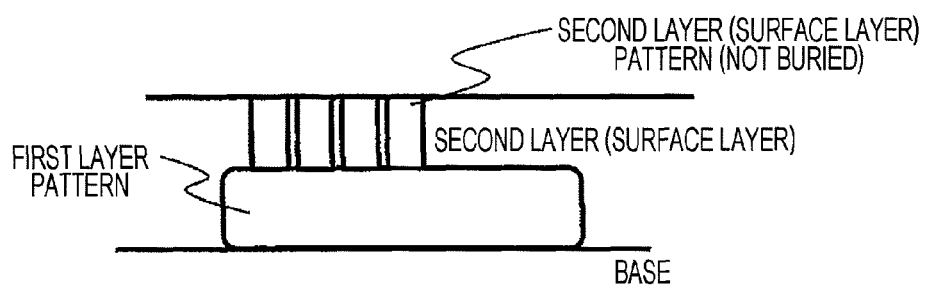
FIGS. 10A and 10B are diagrams illustrating an example of an opening pattern and a method of applying the present invention.

Next, an image restoration process method or a dimension measurement method when an outermost surface pattern is not buried will be described using FIGS. 10A and 10B. In the patterns described in FIGS. 2A to 2E, the inner portions of the hole patterns formed in the surface layer are buried with the conductive material. However, as illustrated in FIG. 10A, the observation and the measurement may be performed in a state before the hole patterns are buried, that is, a state in which pattern portions are opened. In this case, the higher quality observation and the measurement with high precision can be executed based on a relation of the structure of the patterns laminated in the same way as the first to fourth embodiments and the electron beam radiation conditions.

Figure 10B:
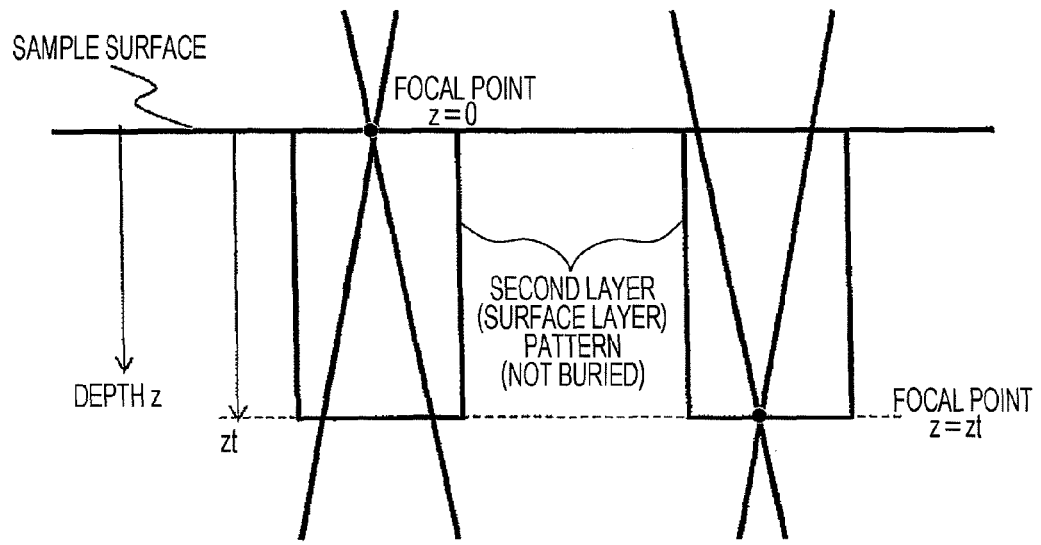

As illustrated in FIG. 10A, when an outermost surface pattern is not buried, a beam diameter of a hole bottom portion is changed by the focal point of the electron beam as illustrated in FIG. 10B. When a state of a pattern bottom portion is to be observed, it is anticipated that information on the hole bottom is obtained more clearly by focusing on a depth of the hole bottom rather than focusing on the outermost surface as illustrated at the left side of FIG. 10B. In this case, an image is imaged by focusing on the focusing depth of the opening portion. In addition, for the opening portion, it is only necessary to execute an image restoration process using a beam diameter set without considering an influence of scattering in the solid; and for a portion other than the opening portion, an image restoration process using an effective beam diameter.

At this time, electrons (for example, secondary electrons) having low energy among electrons generated in the hole bottom are not likely to arrive at the outside of the hole, and electrons having relatively high energy are likely to have information on the hole bottom. Meanwhile, in an edge of a surface such as an upper end of the hole, emission efficiency of the secondary electrons is high. In addition, the electrons generated from the buried layer lose energy before the electrons arrive at the outermost surface. For this reason, the electrons generated from the buried layer include electrons of various energies. As such, characteristics of electrons in which information can be easily obtained are different according to a surface state of a focusing layer. Therefore, an appropriate image may be selected or weighted, for example, such that a reflected electron image is used for the hole bottom portion, the secondary electron image is used for the surface portion, and both electron signals are used for the buried layer pattern.

In addition, as illustrated in FIG. 10B, a beam is not parallel and has some opening angle. For this reason, in an end of the hole bottom, a part of the beam may be blocked by the pattern before the beam arrives at the hole bottom. In this case, if an effective beam shape set in view of an influence of electrons passing through a sidewall portion is considered, image restoration with higher precision can be achieved. In addition, it is effective to select a focal point where a ratio of the blocked electrons is limited.

According to the embodiments described above, the optimal imaging conditions and the detection conditions can be determined to obtain information on the patterns of the desired opening and the buried layer. In addition, the imaging condition optimization and the first to fourth embodiments may be combined so that the higher quality observation and inspection, as well as the measurement of the dimensions or the misalignment amount with high precision can be realized.

The pattern measurement techniques described above can be applied to a case in which image acquisition and simulation are performed in the electron microscope or the discharged particle beam apparatus similar to the electron microscope. The measurement of the patterns formed by the exposure process of the semiconductor pattern has been described herein. However, the pattern measurement techniques can be applied to an MEMS or minute industrial components.

What is claimed is:

1. A charged particle microscope apparatus, comprising:
    a radiation optical system that radiates a focused charged particle beam to an upper side of a sample provided with a pattern and scans the sample with the charged particle beam, the sample having a laminate structure including a plurality of layers;
    a detection optical system that detects charged particles generated from the sample to which the charged particle beam has been radiated by the radiation optical system; and
    a processing unit that:
        processes the charged particles detected by the detection optical system to obtain a charged particle image of the sample,
        estimates diffusion of the charged particles at any depth of the pattern of the sample based on the laminate structure of the sample, a material of each layer and a thickness of each layer, and information on radiation energy of the charged particle beam in the radiation optical system,
        corrects the obtained charged particle image using the estimated diffusion of the charged particles, and
        processes the corrected charged particle image.

2. The charged particle microscope apparatus according to claim 1, wherein:
    the processing unit executes any one of processes of detecting defects of the pattern on the sample, classifying the defects of the pattern on the sample, measuring dimensions of the pattern on the sample, and measuring a shape of the pattern on the sample, using the corrected charged particle image.

3. The charged particle microscope apparatus according to claim 1, wherein:
    in the processing unit, the diffusion of the charged particles at any depth of the pattern of the sample is estimated on the basis of the depth of the pattern of the sample.

4. The charged particle microscope apparatus according to claim 1, wherein:
    in the processing unit, pattern dimension measurement is executed on a first image and a second image, the first image being the corrected charged particle image and the second image being the charged particle image before the correction,
    a difference between a pattern dimension measurement result of the first image and a pattern dimension measurement result of the second image is set as a measurement error, and
    the charged particle image of the sample obtained by processing the charged particles detected by the detection optical system is corrected using the measurement error, when the pattern is measured.

5. The charged particle microscope apparatus according to claim 1, wherein:
    imaging conditions of the charged particle beam in the radiation optical system are conditions where an information amount is maximized, using a model of a characteristic of scattering of the charged particles in a solid and an emission characteristic of the charged particles.

6. An image acquisition method of a charged particle microscope apparatus, comprising:
- radiating a focused charged particle beam to an upper side of a sample provided with a pattern and scanning the sample with the charged particle beam, the sample having a laminate structure including a plurality of layers;
- detecting charged particles generated from the radiated sample;
- processing the detected charged particles to obtain a charged particle image of the sample;
- estimating diffusion of the charged particles at any depth of the pattern of the sample based on the laminate structure of the sample, a material of each layer and a thickness of each layer, and radiation energy of the charged particle beam;
- correcting the obtained charged particle image using the estimated diffusion of the charged particles, and
- processing the corrected charged particle image.

7. The image acquisition method according to claim 6, further comprising:
- using the corrected charged particle image for detecting defects of the pattern on the sample, classifying the defects of the pattern on the sample, measuring dimensions of the pattern on the sample, or measuring a shape of the pattern on the sample.

8. The image acquisition method according to claim 6, wherein:
- the diffusion of the charged particles at any depth of the pattern of the sample is estimated on the basis of a depth of the pattern of the sample.

9. The image acquisition method according to claim 6, wherein:
- pattern dimension measurement is executed on a first image and a second image, the first image being the corrected charged particle image and the second image being the charged particle image before the correction,
- a difference between a pattern dimension measurement result of the first image and a pattern dimension measurement result of the second image is set as a measurement error, and
- the charged particle image of the sample obtained by processing the detected charged particles is corrected using the measurement error, when the pattern is measured.

10. The image acquisition method according to claim 6, wherein:
- imaging conditions of the radiated charged particle beam are conditions where an information amount is maximized, using a model of a characteristic of scattering of the charged particles in a solid and an emission characteristic of the charged particles.

* * * * *